(12) United States Patent
Feng

(10) Patent No.: US 8,294,254 B2
(45) Date of Patent: Oct. 23, 2012

(54) CHIP SCALE SURFACE MOUNTED SEMICONDUCTOR DEVICE PACKAGE AND PROCESS OF MANUFACTURE

(75) Inventor: Tao Feng, Santa Clara, CA (US)

(73) Assignee: Alpha and Omega Semiconductor Incorporated, Sunnyvale, CA (US)

(*) Notice: Subject to any disclaimer, the term of this patent is extended or adjusted under 35 U.S.C. 154(b) by 0 days.

(21) Appl. No.: 13/409,625

(22) Filed: Mar. 1, 2012

(65) Prior Publication Data

US 2012/0161307 A1    Jun. 28, 2012

Related U.S. Application Data

(62) Division of application No. 12/507,778, filed on Jul. 22, 2009, now Pat. No. 8,222,078.

(51) Int. Cl.
    *H01L 23/02*    (2006.01)
(52) U.S. Cl. ........ 257/686; 257/684; 438/106; 438/113; 438/110; 438/460
(58) Field of Classification Search .......... 257/678–713; 438/106, 113, 460, 110
    See application file for complete search history.

(56) References Cited

U.S. PATENT DOCUMENTS

| | | | |
|---|---|---|---|
| 3,972,062 | A | 7/1976 | Hopp |
| 6,133,634 | A | 10/2000 | Joshi |
| 6,355,502 | B1 | 3/2002 | Kang et al. |
| 6,469,384 | B2 | 10/2002 | Joshi |
| 6,624,522 | B2 | 9/2003 | Standing |
| 6,646,329 | B2 | 11/2003 | Estacio et al. |
| 6,653,740 | B2 | 11/2003 | Kinzer |
| 6,767,820 | B2 | 7/2004 | Standing et al. |
| 7,955,893 | B2 | 6/2011 | Feng |
| 2003/0052405 | A1 | 3/2003 | Moriguchi |
| 2003/0067071 | A1 | 4/2003 | Cardwell |
| 2003/0207546 | A1 | 11/2003 | Wajima |
| 2006/0068536 | A1 | 3/2006 | Yamazaki |
| 2008/0274603 | A1 | 11/2008 | Do et al. |
| 2009/0008715 | A1 | 1/2009 | Yamazaki |

(Continued)

FOREIGN PATENT DOCUMENTS

JP    9129867    5/1997

(Continued)

OTHER PUBLICATIONS

PCT International Search Report dated Jul. 27, 2009 for International Patent Application No. PCT/US2009/032242.

(Continued)

*Primary Examiner* — Telly Green
(74) *Attorney, Agent, or Firm* — Joshua D. Isenberg; JDI Patent

(57) ABSTRACT

A semiconductor device package die and method of manufacture are disclosed. The device package die may comprise a device substrate having one or more front electrodes located on a front surface of the device substrate and electrically connected to one or more corresponding device regions formed within the device substrate proximate the front surface. A back conductive layer is formed on a back surface of the device substrate. The back conductive layer is electrically connected to a device region formed within the device substrate proximate a back surface of the device substrate. One or more conductive extensions are formed on one or more corresponding sidewalls of the device substrate in electrical contact with the back conductive layer, and extend to a portion of the front surface of the device substrate. A support substrate is bonded to the back surface of the device substrate.

14 Claims, 7 Drawing Sheets

U.S. PATENT DOCUMENTS

| | | |
|---|---|---|
| 2009/0166896 A1 | 7/2009 | Yamazaki et al. |
| 2009/0194880 A1 | 8/2009 | Feng et al. |
| 2010/0065949 A1 | 3/2010 | Thies et al. |
| 2011/0018116 A1 | 1/2011 | Feng |
| 2011/0107589 A1 | 5/2011 | Hebert et al. |
| 2011/0108896 A1 | 5/2011 | Feng |
| 2011/0127652 A1 | 6/2011 | Bonkohara |

FOREIGN PATENT DOCUMENTS

| | | |
|---|---|---|
| WO | 0175961 | 10/2001 |

OTHER PUBLICATIONS

Notice of Allowance and Fee(s) due mailed Feb. 3, 2012 for U.S. Appl. No. 12/606,005.

CHIP SCALE SURFACE MOUNTED SEMICONDUCTOR DEVICE PACKAGE AND PROCESS OF MANUFACTURE

PRIORITY CLAIM

This application is a divisional application claiming the benefit of priority of commonly assigned U.S. patent application Ser. No. 12/507,778, filed Jul. 22, 2009, the entire disclosure of which is herein incorporated by reference.

FIELD OF THE INVENTION

Embodiments of the present invention are related to semiconductor device manufacturing and more particularly to wafer level manufacturing of surface mounted chip-scale semiconductor device packages.

BACKGROUND OF INVENTION

Semiconductor devices face a number of challenges during the formation of a plurality of device package dies on a wafer. This is particularly the case for chip scale package metal oxide semiconductor field effect transistor (MOSFET) devices, especially vertical conduction power MOSFET devices having gate and source regions on one surface of a semiconductor substrate and a drain region on the opposite surface.

Electrical connections on one surface of a given semiconductor device and electrical connections on the other surface of the device must be extended to a common plane to allow for post-packaging use of the device. Extending back surface connections to the front surface of a given semiconductor device increases the device package size, and when performed on a wafer level, reduces the number of semiconductor device package dies that can fit on a given wafer. For semiconductor devices such as vertical conduction power MOSFET devices, it is desirable to work towards a smaller land pattern/minimized footprint and a smaller package thickness. This allows for a single wafer to fit a greater number of semiconductor device package dies, thus moving towards an optimal true chip scale package. It is similarly desirable to have a smaller electrical resistance associated with each semiconductor device package die. This may be accomplished by avoiding traditional wire bonding interconnections and by reducing the thickness of the semiconductor device package die. Better thermal dissipation is another desirable feature for semiconductor device package dies, and this can be achieved by using bottom and top exposure. Another desired result is providing greater support to the semiconductor device. Greater stability associated with greater support will also minimize the risk of chipping the semiconductor device chip/substrate. Lastly, it is important that the fabrication of these semiconductor device package dies be accomplished as a wafer level batch process in order to maximize efficiency and minimize the time needed to produce these semiconductor device package dies.

For semiconductor devices with multiple connections on one surface and one connection on the opposite surface (e.g., MOSFET device), achieving the desired features discussed above will require novel arrangement in extending connections to a common plane. It is also generally desirable to have simple, quick, and efficient methods of packaging semiconductor devices. Thus, numerous packaging concepts and methods have been developed in the prior art.

While silicon process technology has advanced significantly in the past decade, for the most part, the same decades-old packaging technology continues as the primary packaging means. Epoxy or solder die attachment along with aluminum or gold wire bonding to a lead frame is still the dominant semiconductor packaging methodology. Advances in semiconductor processing technology, however, have made parasitics (e.g., resistances, capacitances, and inductances) associated with conventional packaging techniques more of a performance-limiting factor. In the case of conventional flip chip technology, among other shortcomings, electrical connection to the back side of the device is not easily facilitated while keeping a small footprint. These limitations become quite significant in high current applications such as power switching devices.

US publication number 2003/052405 discloses a vertical power MOSFET device with the drain electrode formed on the bottom surface of the silicon substrate connected to the lead frame above it, whereas the source electrode and the drain electrode are exposed to the bottom of the device. The MOSFET device is sealed by a resin, such as epoxy or silicone, such that the MOSFET device and an inner part of the lead frame are covered. On the bottom surface of the MOSFET device, the surface of the resin is approximately flush with surfaces of the lead frame and gate/source electrodes. That is, on the bottom surface of the semiconductor device, the bottom surface of outer lead portions of the lead frame and bottom surfaces of gate/source electrodes are exposed for connection to a conducting pad (mount surface) of the mounting substrate. Then the perimeter of these gate/source electrodes is covered by the resin.

U.S. Pat. No. 6,133,634 discloses a flip chip package having a power MOSFET device including a drain terminal, a source terminal, and a gate terminal. The drain terminal connects to a conductive carrier and an outer array of solder balls. The source terminal and gate terminal connect to an inner array of solder balls. The conductive carrier and the outer array of solder balls provide electrical connection to the drain terminal in the same plane as electrical connections to the source terminal and gate terminal.

The preceding prior art package designs for vertical power MOSFET devices can provide electrical interconnection for source, gate and drain for individual MOSFETs. However, additional assembly steps are needed after a wafer has been singulated into individual dies, which precludes further wafer level processing, which increases costs and fabrication time. In addition, the use of metal clips to provide drain contacts from the back to front sides of the die can reduce the available space for the device in a device package die. It would be desirable to produce a package design and process for its manufacture which permits wafer level processing with lower costs and a reduced footprint for individual part.

It is within this context that embodiments of the present invention arise.

DESCRIPTION OF THE SPECIFIC EMBODIMENTS

Although the following detailed description contains many specific details for the purposes of illustration, anyone of ordinary skill in the art will appreciate that many variations and alterations to the following details are within the scope of the invention. Accordingly, the examples of embodiments of the inventions described below are set forth without any loss of generality to, and without imposing limitations upon, the claimed invention.

Figure 1A:
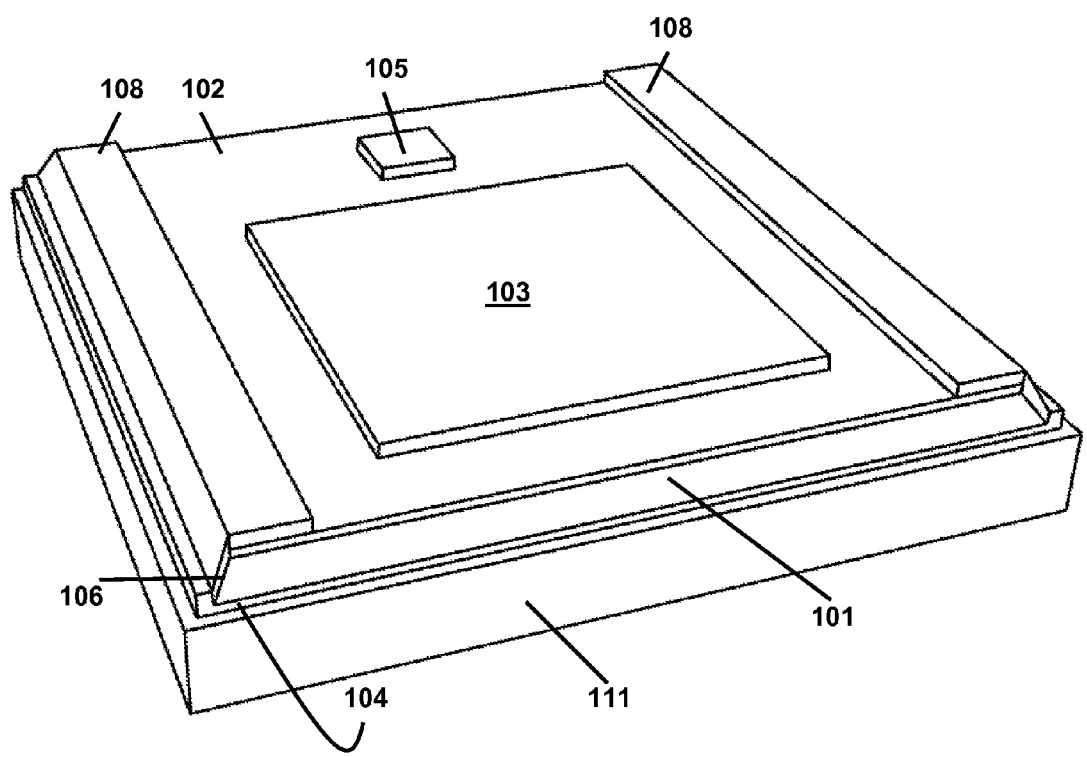
FIG. 1A is a perspective view from a front side of a semiconductor device package die according to an embodiment of the present invention.
Figure 1B:
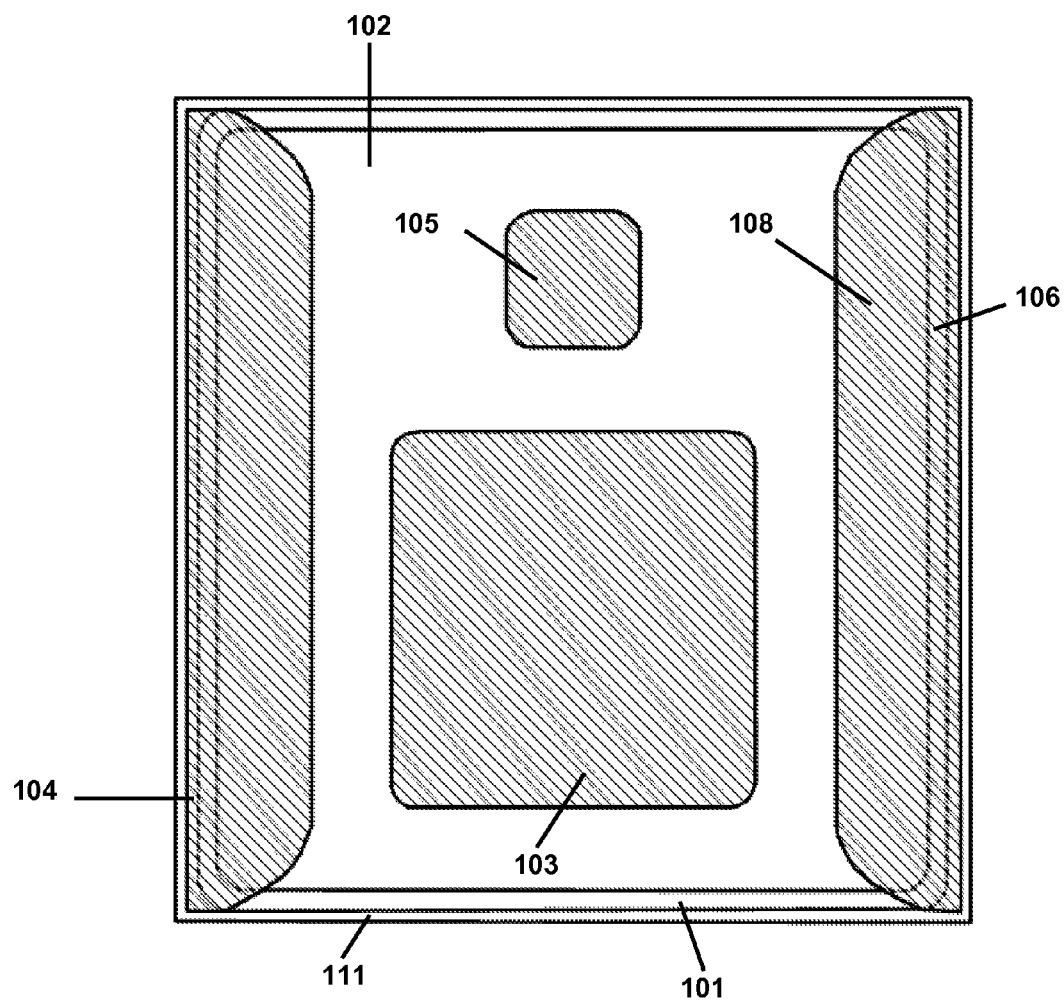
FIG. 1B is a top view from a front side of a semiconductor device package die according to an embodiment of the present invention.

According to an embodiment of the present invention a device package may be configured as depicted in FIGS. 1A-1B. The device package die 100 generally includes a device substrate 101 attached to a support substrate 111. One or more active devices are formed in the device substrate 101. The device substrate 101 may be made of a semiconductor material, such as silicon. By way of example, the active devices may be vertical metal oxide semiconductor field effect transistor (MOSFET) devices. The active devices may include source, gate and drain regions formed within the device substrate 101 by conventional semiconductor device fabrication processes.

The support substrate 111, also known as a support chip, provides mechanical support to the active device. This allows the active device to be formed in a much thinner device substrate 101 than would be possible without the support substrate. The support substrate 111 may also provide further electrical conduction with the active device and a better means for thermal dissipation. The preferred range of thickness for the device substrate 101 is less than 6 mils. The support substrate may be thicker than the device substrate. By allowing for a much thinner device substrate 101, the electrical resistance associated with the support substrate 111 may be reduced. By way of example, and not by way of limitation, the support substrate 111 may be of the same material as the device substrate 101 or of a material with a coefficient of thermal expansion closely matched to the device substrate 101.

The coefficients of thermal expansion of the device substrate and support substrate may be regarded as sufficiently closely matched if the support substrate material has a CTE within +100% of the CTE for the device substrate material. By way of example, the CTE of silicon (Si) is $2.6 \times 10^{-6} K^{-1}$ at 25° C., and less than $4 \times 10^{-6} K^{-1}$ at any possible packaging process or device operation temperature range. Other materials with CTE between 0 and $8 \times 10^{-6} K^{-1}$ can be considered closely matched to a Si device substrate. Copper has CTE of $16.5 \times 10^{-6} K^{-1}$ at 25° C. and would not be considered closely matched to Si.

The device substrate 101 includes electrical connections formed on two opposite sides. For example, if the devices formed within the substrate 101 are diodes electrical contacts to differently doped semiconductor regions may be formed on opposite sides of the device substrate 101. By way of example, and not by way of limitation, in the case of a MOSFET device, a source electrode 103 and a gate electrode 105 may be located on the front side of a device substrate 101 and electrically connected to underlying source and gate regions.

The source electrode 103 and gate electrode 105 are electrically connected to source regions and gate regions of the active devices which may be formed proximate the front side of the device substrate 101. A back conductive layer 104 may be formed on a back side of the device substrate 101, to make contact to the drain region of the device. The back conductive layer 104 is generally disposed between the device substrate 101 and the support substrate 111. A drain electrode may make electrical contact with a drain region formed within the device substrate proximate the back side by means of the back conductive layer 104 and side extensions 108. In alternative embodiments, the device substrate 101 may incorporate a device architecture in which the gate and drain connections are made to the front side and the source connection is made from the back. Furthermore, it is within the scope of embodiments of the present invention for the gate and drain connections to be made from one side while the source connection is made from the back side.

The source electrode 103 and gate electrode 105 may make contact with the source and gate regions through openings in a passivation layer 102 formed on a surface of the device substrate 101. The passivation layer 102 may be implemented as, by way of example, polyimide, silicon nitride, silicon oxide, or silicon oxi-nitride, and is configured to insulate electrodes 103, 105, and extensions 108 from electrical contact with each other.

To make electrical contact to the drain possible from the front side of the device package 100, the back conductive metal layer 104 may be electrically connected to electrically conductive extensions 108 that are located along one or more sidewalls 106 of the device substrate 101, and extend over a portion of the front side of the device substrate 101. The combination of the back conductive metal layer 104 and the conductive extensions 108 act as a drain electrode that can make electrical contact from the same side of the device as the other front side electrodes 103, 105. On the front side of the device, the source electrode 103 and gate electrode 105 are approximately coplanar with the conductive extensions 108 of the drain electrode. Each of the conductive extensions 108 may extend along a length of an edge of the device substrate 101. To facilitate formation of the conductive extensions 108, the sidewalls 106 may be beveled at an angle, e.g., a 55 degree slope. The sloping of the sidewalls 106 facilitates deposition of conductive material onto the sidewalls 106 during the formation of the extension portions 108. By forming the conductive extensions 108 along the length of edges of the device substrate 101, electrical contact from the back to the front of the device substrate is achieved.

The source electrode 103, gate electrode 105, back conductive layer 104 and extensions 108 may be formed by selectively electroplating portions of the device package die 100 with metal, such as copper (Cu), or by electrolessly plating selected portions of the device package die 100 with a metal combination such as nickel/gold (Ni/Au) or another plating material. NiAu comprises a layer of nickel with a relatively thin layer of gold on it to prevent oxidation. The conductive extensions 108 provide one or more front side electrical contacts that are electrically connected to a drain region, formed within the backside of the device substrate 101, by a back conductive layer 104 on the backside of the device substrate 101 and extensions 108. The back conductive layer 104 may be formed through evaporating, sputtering, or electroplating the back surface of the device substrate 101 with metal, such as Ti—Ni—Cu, Ti—Ni—Al, Ti—Ni—Ag, or Ti—Ni—Au. For convenience, the device substrate 101, including all electrodes 103, 105, 108 and the back conductive layer 104, will be referred to as the active device.

This implementation of a semiconductor device package die 100 achieves the goal of extending all of a device's electrodes to a common plane without compromising the allowable size of a semiconductor device by limiting the area sacrificed during extension of electrodes to a common plane. This in turn, allows for a greater number of semiconductor device package dies 100 to be formed from a given wafer, and reduces the package footprint, bringing us closer to a true chip scale package. A smaller electrical resistance associated with the semiconductor substrate 101 is also achieved through the reduction in thickness of the semiconductor substrate 101, which is feasible because of the addition of a support substrate 111. In addition to physical support, the support substrate 111 also prevents the device package die 100 from easily chipping and may allow for better thermal dissipation.

Device package dies of the type shown in FIG. 1A-FIG. 1B may be manufactured according to an inventive method as illustrated in FIGS. 2A-2K. This method of packaging may be implemented at the wafer level for a plurality of semiconductor device dies. Furthermore, many of these steps may be performed in a wafer batch level, e.g., multiple wafers at the same time. For the sake of clarity, an area corresponding to the packaging of only two semiconductor device dies is illustrated. Those of skill in the art will recognize that these two dies may represent many more of such dies formed on a semiconductor device substrate.

Figure 2A:
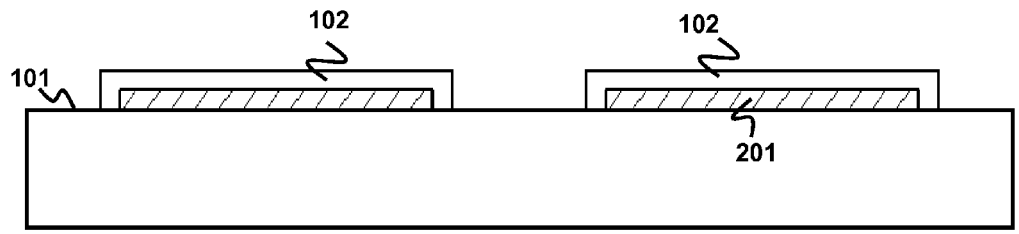
FIGS. 2A-2K are cross-sectional view diagrams illustrating a method for manufacturing a plurality of semiconductor device package dies according to an embodiment of the present invention.

As depicted in FIG. 2A, the fabrication of device package die 200 begins with the formation of device structures, e.g., MOSFET devices, in a device substrate 101. The formed device package dies 200 are shown in FIG. 2K. By way of example, and not by way of limitation, the device substrate 101 may include a source region and gate region that are formed proximate a front surface of the device substrate 101 and a drain region that is formed proximate a back surface of the device substrate 101. The devices formed within the device substrate 101 may be electrically connected to one or more front side contacts 201. By way of example, the front side contacts 201 may include a source pad and a gate pad that are located on the front surface of the device substrate 101. The source pad and gate pad (not shown) may be electrically isolated from each other by a passivation layer 102. By way of example, the passivation layer 102 may be formed using polyimide, silicon nitride, silicon oxide, or silicon oxi-nitride.

Figure 2B:
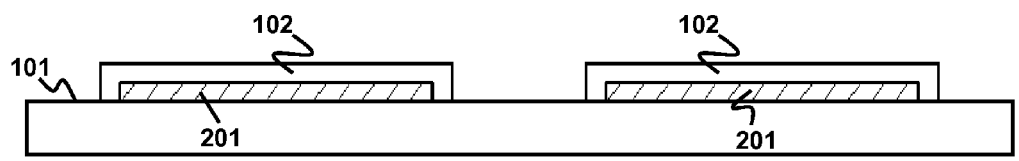

As shown in FIG. 2B, a back surface of the device substrate 101 is thinned to a desired thickness. By way of example, the device substrate 101 may be ground down to a thickness of about 100 microns (μm) or less, preferably about 50 μm or less. By grinding down the back surface of the device substrate 101 to the desired thickness, we can effectively reduce the overall electrical resistance associated with the finished device package die 200. As alternatives to grinding the device substrate an etch process may also be used to make wafer thinner. The etch process is preferably used in conjunction with mechanical grinding, more preferably, following mechanical grinding.

Figure 2C:
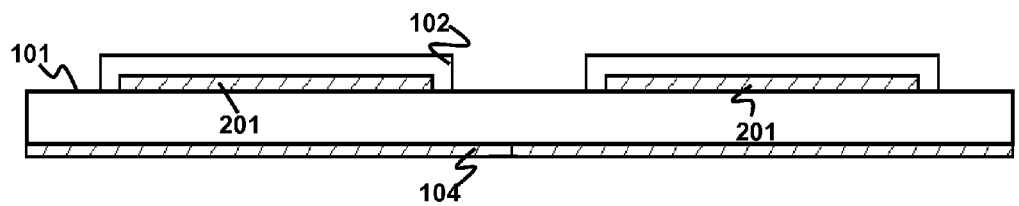

The back surface of the device substrate 101 may then be cleaned and metalized to form a back conductive layer 104 on the back surface of the device substrate 101 as illustrated in FIG. 2C. The back conductive layer 104 may provide an electrical connection to a drain region formed within the back surface of the substrate 101. The metallization of the back surface of the device substrate 101 may begin with the deposition of a thin layer of seed metal on the back surface of the device substrate 101. The seed metal layer may be a thin metal layer or metal alloy layer compatible with the back conductive layer 104 material to be deposited over it. By way of example, in a case where copper (Cu) is to be used as the back conductive layer 104, the seed layer may be formed by a layer of TiCu with a thickness less than 4 μm. Once the metal seed layer has been deposited, a conductive layer 104 may be formed, e.g., by electroplating the back surface of the device substrate 101 with metal, such as nickel (Ni) followed by copper (Cu). Alternatively, the back conductive layer 104 may be made of other materials such as TiNiAg, TiNiAu, TiNiAl, etc., e.g., through sputtering or evaporation.

Figure 2D:
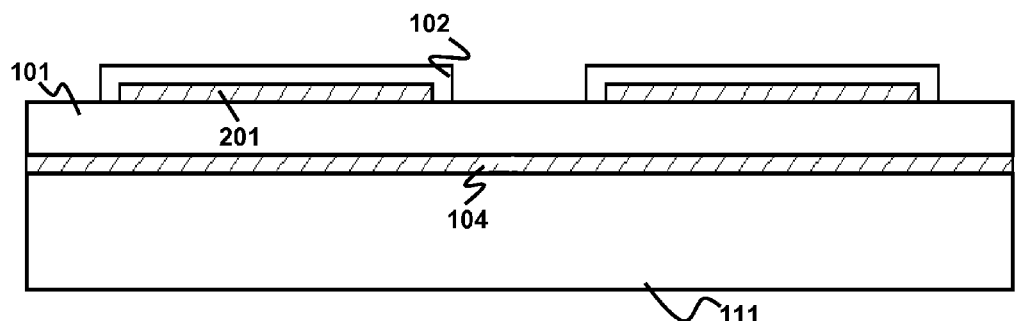
Figure 3A:
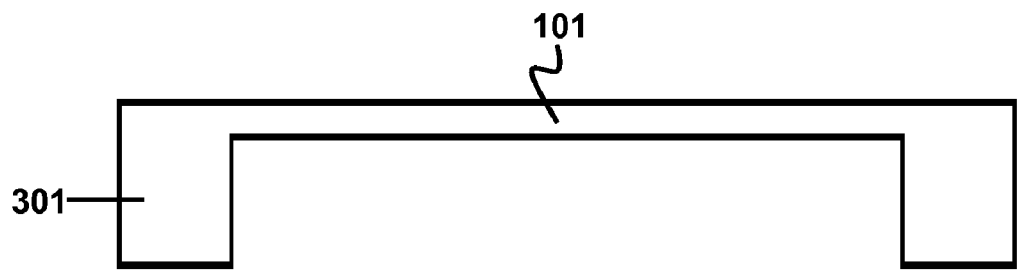
FIGS. 3A-3C are schematic diagrams that illustrate a possible wafer level view of the method of grinding, forming a back conductive layer, and bonding a support wafer corresponding to FIGS. 2B-2D.
Figure 3B:
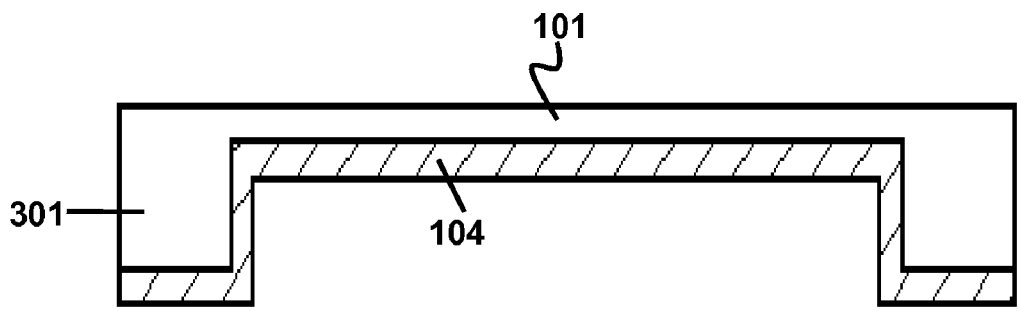
Figure 3C:
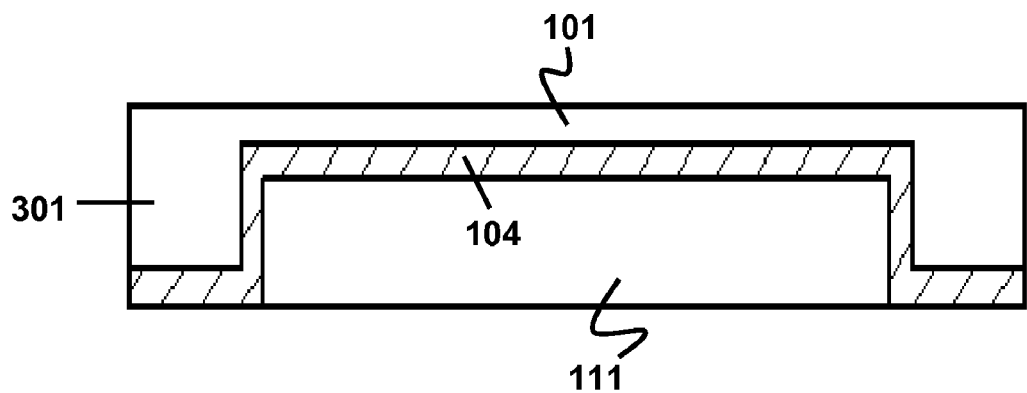

As depicted in FIG. 2D, a support substrate 111 is bonded to the back side of the device substrate 101 to form a package substrate. The support substrate 111 may be directly bonded to the back conductive layer 104 that was formed on the back surface of the device substrate 101. By way of example, and not by way of limitation, the support substrate 111 may be bonded to the device substrate 101 with epoxy or by using a eutectic approach. The support substrate 111 may be in the form of a substrate with a coefficient of thermal expansion closely matched to the coefficient of thermal expansion of the device substrate 101. Alternatively, the support substrate 111 may be made of the same material as the device substrate 101. For example, if the device substrate 101 is made of silicon, the support substrate 111 may also be made of silicon. Alternatively, the support substrate 111 may be made of Kovar or Alloy 42 (Nickel-Iron alloys), which have coefficients of thermal expansion that closely matches that of silicon. The support substrate 111 provides mechanical stability to the device package die 200 to compensate for the stability that was lost as a result of the thinning of the device substrate 101. The addition of this support substrate 111 lessens the likelihood of the device package die 200 being damaged during handling and may also allow for better thermal dissipation of the device package die 200. Bonding the thinned device substrate 101 to the support substrate 111 allows the resulting package substrate to be made sufficiently rigid and/or robust that it can be handled by conventional wafer handling equipment during subsequent processing. By way of example, the package substrate may have the same thickness as a conventional wafer that is normally handled by such equipment. The approximate total thickness for the package including device substrate 101 plus support substrate 111 may be at least 0.25 mm, but less than 0.9 mm for practical products. FIGS. 3A-3C show a possible implementation of the steps shown in FIGS. 2B-2D, respectively, from a wafer level view, and will be described later in the text.

Figure 2E:
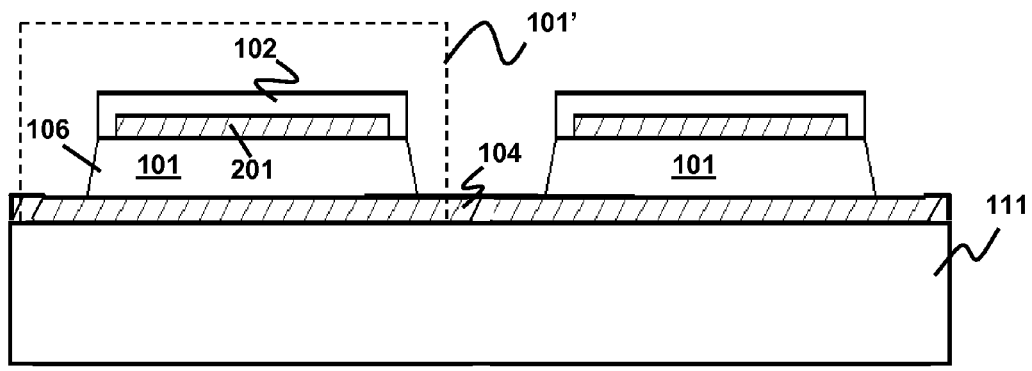

As shown in FIG. 2E, an anisotropic etch is performed on the device substrate 101 to separate the device substrate into individual device die 101' that are attached to a common support substrate 111. The anisotropic etch defines sidewalls 106 on the sides of each device die 101'. The anisotropic etch may be performed using a mask and stop layer to shield the back conductive layer 104, passivation layer 102, front side contacts 201, and support substrate 111 from being etched. By way of example, and not by way of limitation, if the device substrate 101 is made of silicon the anisotropic etch may be a wet etch using potassium hydroxide (KOH). An advantage of using a wet etch over using a dry etch is that it can be performed as a wafer batch process, rather than one wafer at a time. By way of example, and not by way of limitation, the mask may be implemented using nitride i.e. passivation layer 102, and the stop layer may be implemented using Ni deposited in previous back metallization step, for the best results in conjunction with the KOH wet etch. If passivation layer 102 is used as the mask, there is no need for an additional photo-resist mask at this step. The KOH wet etch etches silicon along a specific crystallographic plane of the device substrate 101, such that a beveled sidewall 106 is formed with a slope, e.g., about 55 degrees. The beveled sidewalls 106 allows for easier future deposition of a conductive layer on the sidewall 106.

Figure 2F:
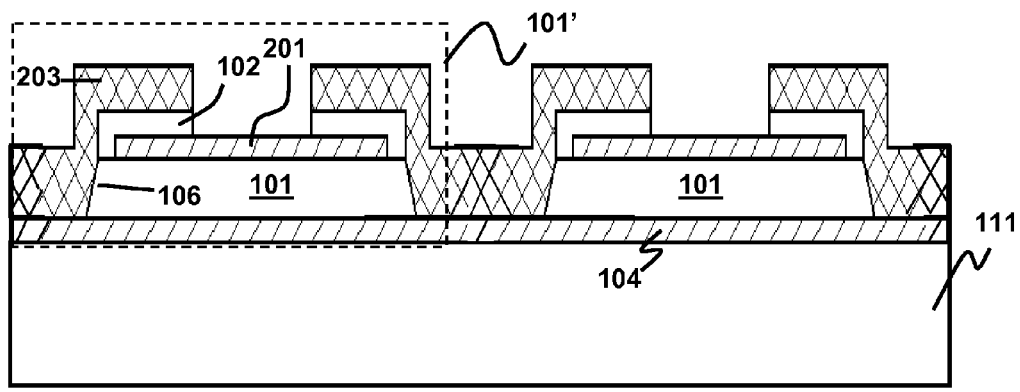

FIG. 2F illustrates the next step in the packaging process. A photo-resist mask 203 is formed over the device package die 200 and configured to leave an area of the passivation layer 102 that rests above the front side contacts 201 exposed. By way of example, and not by way of limitation, the photo-resist mask 203 may be formed, e.g., using a spray-on photo-resist technique. An etch of the exposed passivation layer 102 may then be performed, exposing selected portions of the front side contacts 201. In this way, the passivation layer 102 may be selectively removed to expose a source pad 201 and a gate pad. The etch process used to etch away the exposed portions of the passivation layer 102 may be a standard dry etch or wet etch. It is important to note that FIG. 2F illustrates the result of this step after etching away of the exposed passivation layer 102 has been performed.

Figure 2G:
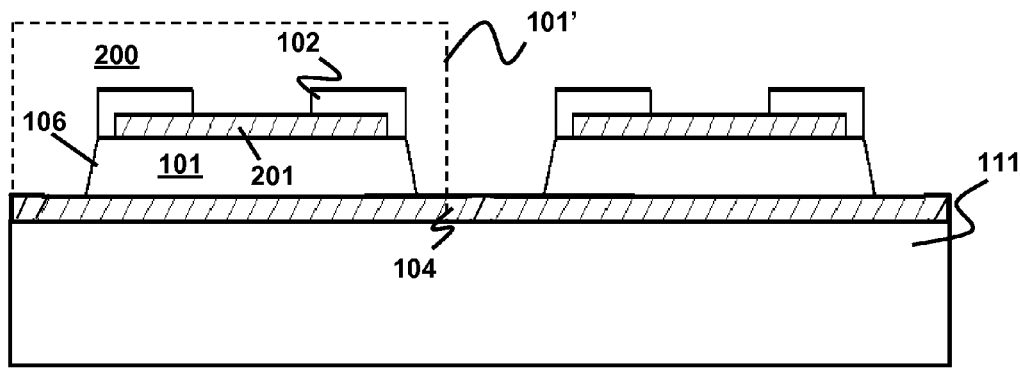

After etching away part of the passivation layer 102 to expose the front side contacts 201, the photo-resist mask 203 may be removed as illustrated in FIG. 2G. By way of example, the photo-resist mask 203 may be removed using a resist stripper that chemically alters the resist so that it no longer adheres to the device die 101', or the photo-resist mask 203 may be removed by a plasma containing oxygen that oxidizes the resist. Once the photo-resist mask 203 has been removed, conductive material may be selectively formed over exposed portions of the back conductive layer 104, the beveled sidewalls 106, and portions of the passivation layer 102 on the front side of the device die 101' to extend the electrical connection provided by the back conductive layer 104 to the front side of the device die 101'.

By way of example, and not by way of limitation, a thin layer of seed metal may be deposited on the device package die 200 to facilitate the future deposition of a conductive layer. The seed metal layer is not depicted in FIG. 2G, but is deposited over exposed portions of the back conductive layer 104, the beveled sidewalls 106, portions of the passivation layer 102, and exposed portions of the front side contacts 201. The seed layer may be a thin metal layer or metal alloy layer compatible with a metal material to be deposited over it. By way of example, in a case where copper (Cu) is the metal to be deposited, the seed layer may be formed by a layer of TiCu with a thickness less than 4 μm.

Figure 2H:
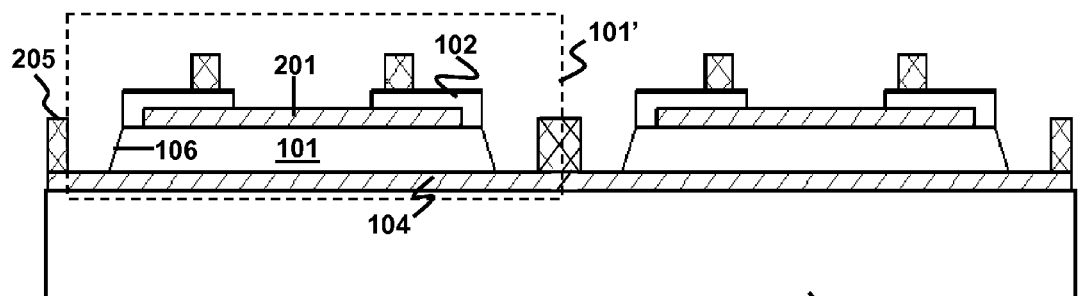

After the seed metal layer has been deposited, a second photo-resist mask 205 may be formed over the device die 101' as shown in FIG. 2H. The second photo-resist mask 205 may be patterned to expose areas of the device die 101' that will undergo metallization. The exposed areas include an area on the back conducting layer 104, the beveled sidewalls 106 of the device 101', an area of the passivation layer 102 on the front side of the device die 101', and the exposed front side contacts 201. By way of example, and not by way of limitation, the second photo-resist mask 205 may be formed using a spray-on photo-resist technique. The second photo-resist mask 205 defines the areas of the device die 101' that will be metalized and shields the rest of the device package die 200 from the metallization process.

Figure 2I:
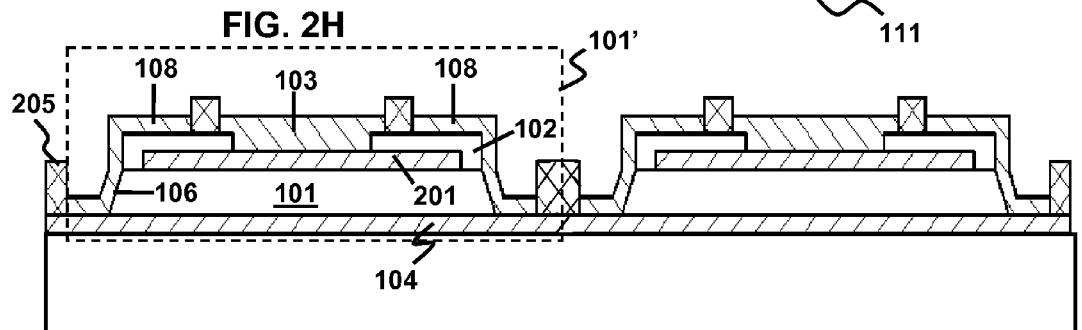

After the second mask 205 has been formed and patterned, a conductive layer may be formed on the areas exposed through the photo-resist mask 205 and over the exposed seed metal to form front side extensions 108 of backside electrical contacts (e.g., drain electrodes) formed by the back conductive layer 104 as shown in FIG. 2I. The extensions 108 are in electrical contact with the back conductive layer 104. The conductive layer may also form front side electrodes 103 (e.g., a source electrode, and a gate electrode (not shown). By way of example, and not by way of limitation, copper (Cu), optionally followed by solder, may be electrically plated over the seed metal layer with a thickness in the range of 5-100 m. The front side electrodes 103 (e.g., source electrode 103 and gate electrode (not shown in FIG. 2)) provide electrical connections to corresponding underlying front side contacts 201, such as a source pad and gate pad (not shown), that lie on the front surface of the device die 101'. The extensions 108 of the backside electrical contacts are located along opposing beveled sidewalls 106 of the device substrate 101, and extend over a portion of the front side of the device substrate 101. The extensions 108 may provide an electrical connection to the drain region formed within the back surface of the device die 101' through the back conductive layer 104. By extending the electrical connection from a backside drain region of the device die 101' to the same plane as the front side electrical connections (e.g., the source region and gate electrodes), the resulting device package die 200 allows for more efficient post-packaging use. Furthermore, this configuration limits the area of the device die 101' that is sacrificed to extend the backside electrodes to a common plane, which in turn increases the number of device die 101' that may be formed on a given wafer, and also brings us closer to a true chip scale package—the footprint of the package being only very slightly larger than the semiconductor die area.

Figure 2J:
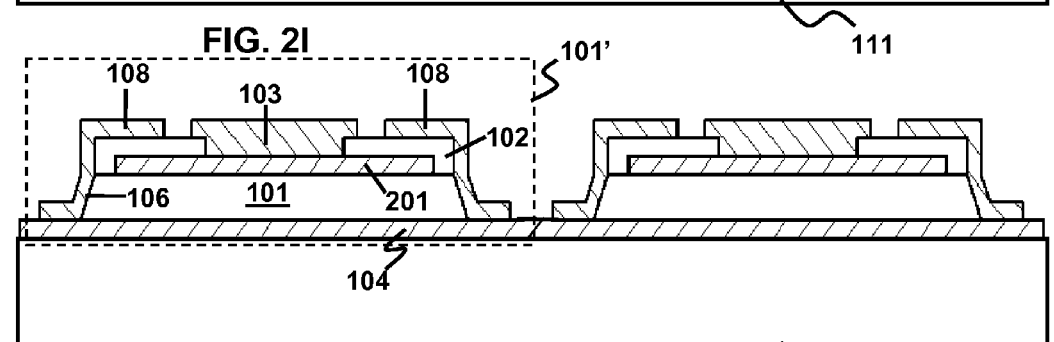
Figure 2K:
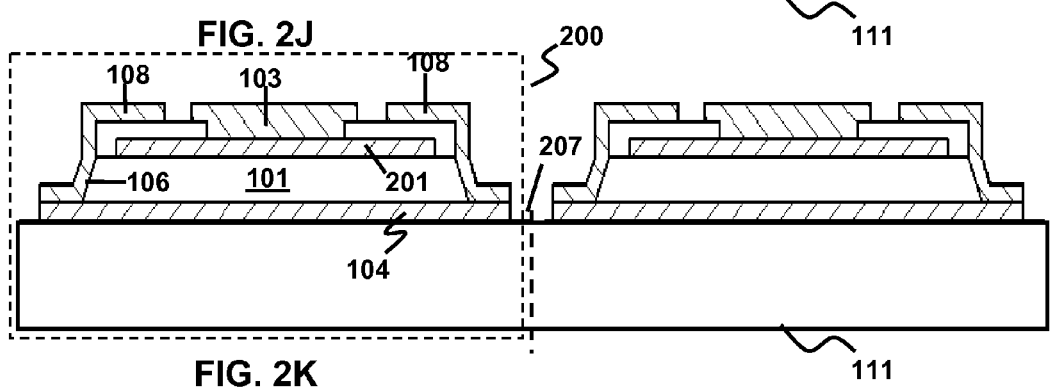

The photo-resist mask 205 is removed as depicted in FIG. 2J and any excess seed metal may be etched away. The photo-resist mask 205 may be removed using a resist stripper that chemically alters the resist so that it no longer adheres to the substrate 101, or the photo-resist mask 205 may be removed by a plasma containing oxygen that oxidizes the resist. Once the photo-resist mask 205 has been removed, seed metal that has not had a conductive layer (e.g., electrodes 103, or extensions 108) deposited on it is etched away. The metal seed layer may be removed by a standard metal etch process. By way of example, the electroplated conductive layers 103, 108 may be much thicker than both seed layer and back metallization layer 104. So metal etching time can be controlled that both seed layer and back metal layer are etched off except those areas covered by thick conductive layer, as shown in FIG. 2K. At this point, the support substrate may be cut along scribe lines 207, e.g., by dicing, between the device die 101' to separate the package substrate into individual device package die 200. If the back conductive layer 104 is much thinner than the electrodes 103, 108 then the back conductive layer 104 on the scribe line 207 may also be removed during the etching process prior to dicing as illustrated in FIG. 2K. If, however, the back conductive layer 104 is not significantly thinner than the copper-plated electrodes 103, 108 it will remain after the etching process as illustrated in FIG. 2J.

FIG. 3A-3C illustrate a possible method of grinding, forming a back conductive layer, and bonding a support wafer that correspond to steps 2B-2D described above, from a wafer level view. All packaging steps prior to 2B may be the same as described above and all packaging steps subsequent to 2D may be as described above. For convenience, this possible method of grinding, forming a back conductive layer, and bonding a support wafer is illustrated with only the device substrate 101, not showing the frontside contacts 201 and passivation layer 102. Multiple device die may be formed on the device substrate 101 as discussed above.

FIGS. 3A-3C show cross sections of the entire wafer. FIG. 3A illustrates a possible method of grinding known as Taiko grinding. Taiko grinding involves grinding a central portion of the bottom surface of a device substrate 101, while leaving a thicker edge 301 around the device substrate 101 as a support ring to provide mechanical support. This method of grinding allows for an ultra thin device substrate 101 that is mechanically stable enough to be handled by conventional equipment during subsequent wafer bonding. After Taiko grinding, the thinner portion of the device substrate 101 may be less than 100 μm thick or even less than 50 μm thick. The thicker edge of the device substrate 101 may be between about 400 μm to the full wafer thickness, e.g., 675 μm, with 500 μm as a typical thickness.

After Taiko grinding of the bottom surface of the device substrate 101 has been accomplished, the back surface of the device substrate 101 may be metalized to form a back conductive layer 104 on the back surface of the device substrate 101 as illustrated in FIG. 3B. The metallization of the back surface of the device substrate 101 may be implemented as described above with respect to FIG. 2C. It is important to note that the back conductive layer 104 may be formed on the back surface of the thinner portion of the device substrate 101, the sidewall of the thicker edge 301, and the back surface of the thicker edge 301 rather than being formed on just the thinner portion of the device substrate 101.

Once the back conductive layer 104 has been formed on the back surface of the device substrate 101, a support substrate 111 may be bonded to the device substrate 101 as illustrated in FIG. 3C. The support substrate 111 is bonded to the back conductive layer 104 formed on the back surface of the thinner portion of the device substrate 101, and possibly also bonded to the back conductive layer 104 formed on the sidewall of the thicker edge 301, but is not bonded to the bottom surface of the thicker edge 301. Once bonding of the support substrate 111 is complete, the packaging of the semiconductor device die continues as described in FIG. 2E-2K.

Figure 4:
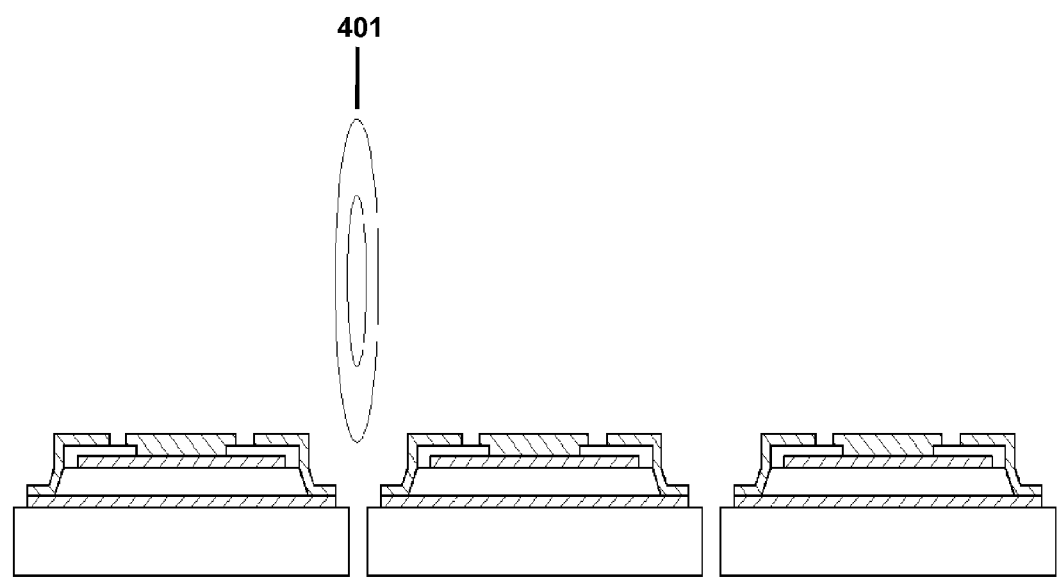
FIG. 4 is a schematic diagram that illustrates dicing through a support substrate to separate a wafer into individual semiconductor device package die using a cutting device.

After the packaging process has completed, the semiconductor device package dies may optionally be diced through the support substrate to separate a package substrate 400 into individual device die packages using a cutting device 401 as illustrated in FIG. 4. If the back conductive layer 104 has been etched through the scribe line as illustrated in FIG. 2K, then the cutting device 401 may be a diamond saw used to dice through the support substrate to separate the wafer 400 into individual parts. If, however, the back conductive layer remains covering the support substrate after the etching process, then the cutting device 401 may be a laser cutter used to dice through the back conductive layer and the support substrate to separate the wafer 400 into individual parts. Alternatively, a hybrid method may be used where the back conductive layer is diced using a laser cutter and the support substrate is diced using a diamond saw to separate the wafer 400 into individual parts. Because separating the package substrate 400 involves cutting the support substrate and not the device substrate there is less risk of damaging the device die.

While the above is a complete description of the preferred embodiment of the present invention, it is possible to use various alternatives, modifications and equivalents. Therefore, the scope of the present invention should be determined not with reference to the above description but should, instead, be determined with reference to the appended claims, along with their full scope of equivalents. Any feature, whether preferred or not, may be combined with any other feature, whether preferred or not.

What is claimed is:

1. A semiconductor device package die comprising:
   a) a device substrate having one or more front electrodes located on a front surface of the device substrate and electrically connected to one or more corresponding device regions formed within the device substrate proximate the front surface;
   b) a back conductive layer formed on a back surface of the device substrate, wherein the back conductive layer is electrically connected to a device region formed within the device substrate proximate a back surface of the device substrate;
   c) one or more conductive extensions in electrical contact with the back conductive layer, wherein the one or more conductive extensions are formed on one or more corresponding sidewalls of the device substrate and extend to a portion of the front surface of the substrate; and
   d) a support substrate bonded to the back surface of the device substrate.

2. The semiconductor device package die of claim 1, wherein the device regions include a source region, a gate region, and a drain region.

3. The semiconductor device package die of claim 2, wherein the one or more device regions formed within the device substrate proximate the front surface of the device substrate comprise a source region and a gate region and the device region formed within the device substrate proximate the back surface comprises a drain region.

4. The semiconductor device package die of claim 1, wherein the one or more front electrodes and the one or more conductive extensions are made from the same conductive material.

5. The semiconductor device package die of claim 1, wherein the one or more conductive extensions are made from a plating material.

6. The semiconductor device package die of claim 1, wherein the one or more front electrodes are approximately coplanar with a portion of the one or more conductive extensions that extends to a portion of the front surface of the substrate.

7. The semiconductor device package die of claim 1, wherein the sidewalls of the device substrate include one or more beveled sidewalls.

8. The semiconductor device package die of claim 7, wherein the beveled sidewalls are characterized by an approximately 55 degree slope.

9. The semiconductor device package die of claim 1 wherein each of the one or more conductive extensions extends along a length of an edge of the device substrate.

10. The semiconductor device package die of claim 1, wherein the device substrate and the support substrate have closely matched coefficients of thermal expansion.

11. The semiconductor device package die of claim 1, wherein the device substrate is less than 100 microns thick.

12. The semiconductor device package die of claim 1, wherein the device substrate and the support substrate consist of the same material.

13. The semiconductor device package die of claim 12, wherein the device substrate and the support substrate are made of silicon.

14. A semiconductor device package substrate comprising:
   a) support substrate,
   b) a plurality of semiconductor device dies formed from a common device substrate attached to the support substrate, wherein the device substrate is divided into the plurality of device dies by removing device substrate material between adjacent die leaving the plurality of device die attached to the support substrate and defining sidewalls of a device substrate portion of each device die, wherein each semiconductor device die includes one or more device regions formed within the device substrate proximate a front surface of the device substrate and a device region formed within the device substrate proximate a back surface of the device substrate, one or more front electrodes in electrical contact to the one or more device regions formed within the device substrate proximate the front surface, one or more conductive extensions formed on one or more corresponding sidewalls of a device substrate portion of each device die and extending to a portion of the front surface of the device die;

c) a back conductive layer formed between the back surface of the device substrate and the support substrate, wherein the back conductive layer is electrically connected to the region formed within each device die proximate the back surface, wherein the back conductive layer is electrically connected to the one or more conductive extensions.

* * * * *